(12) United States Patent
Henley

(10) Patent No.: US 7,351,644 B2
(45) Date of Patent: *Apr. 1, 2008

(54) THIN HANDLE SUBSTRATE METHOD AND STRUCTURE FOR FABRICATING DEVICES USING ONE OR MORE FILMS PROVIDED BY A LAYER TRANSFER PROCESS

(75) Inventor: Francois J. Henley, Aptos, CA (US)

(73) Assignee: Silicon Genesis Corporation, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/521,633

(22) Filed: Sep. 14, 2006

(65) Prior Publication Data

US 2007/0032084 A1    Feb. 8, 2007

Related U.S. Application Data

(63) Continuation of application No. 11/199,870, filed on Aug. 8, 2005, now Pat. No. 7,166,520.

(51) Int. Cl.
    *H01L 21/30* (2006.01)
(52) U.S. Cl. ............... 438/458; 438/455; 257/E21.6
(58) Field of Classification Search .......... 438/455, 438/458; 257/E21.6
    See application file for complete search history.

(56) References Cited

U.S. PATENT DOCUMENTS

| | | |
|---|---|---|
| 2,981,877 A | 4/1961 | Noyce |
| 4,363,828 A | 12/1982 | Brodsky et al. |
| 4,585,671 A | 4/1986 | Kitagawa et al. |
| 4,696,758 A | 9/1987 | Ovshinsky et al. |
| 5,120,394 A | 6/1992 | Mukai |
| 5,789,030 A | 8/1998 | Rolfson |
| 5,877,070 A | 3/1999 | Goesele et al. |
| 6,013,563 A | 1/2000 | Henley et al. |
| 6,033,974 A | 3/2000 | Henley et al. |
| 6,100,166 A | 8/2000 | Sakaguchi et al. |
| 6,103,599 A | 8/2000 | Henley et al. |

(Continued)

OTHER PUBLICATIONS

Agarwal, et. al., Efficient Production of Silicon-on-Insulator Films by Co-Implantation of the He+ with H+, Applied Physics, Mar. 2, 1998, Letters, vol. 72, No. 9.

(Continued)

*Primary Examiner*—Quoc Hoang
(74) *Attorney, Agent, or Firm*—Townsend and Townsend and Crew LLP

(57) ABSTRACT

A method for fabricating one or more devices, e.g., integrated circuits. The method includes providing a substrate (e.g., silicon), which has a thickness of semiconductor material and a surface region. The substrate also has a cleave plane provided within the substrate to define the thickness of semiconductor material. The method includes joining the surface region of the substrate to a first handle substrate. In a preferred embodiment, the first handle substrate is termed a "thin" substrate, which provides suitable bonding characteristics, can withstand high temperature processing often desired during the manufacture of semiconductor devices, and has desirable de-bonding characteristics between it and a second handle substrate, which will be described in more detail below. In a preferred embodiment, the first handle substrate is also thick enough and rigid enough to allow for cleaving according to a specific embodiment.

25 Claims, 11 Drawing Sheets

U.S. PATENT DOCUMENTS

| | | |
|---|---|---|
| 6,171,965 B1 | 1/2001 | Kang et al. |
| 6,180,496 B1 | 1/2001 | Farrens et al. |
| 6,287,941 B1 | 9/2001 | Kang et al. |
| 6,368,930 B1 | 4/2002 | Enquist |
| 6,455,399 B2 | 9/2002 | Malik et al. |
| 6,500,694 B1 | 12/2002 | Enquist |
| 6,534,381 B2 | 3/2003 | Cheung et al. |
| 6,563,133 B1 | 5/2003 | Tong |
| 6,586,785 B2 | 7/2003 | Flagan |
| 6,627,531 B2 | 9/2003 | Enquist |
| 6,653,212 B1 | 11/2003 | Yamanaka et al. |
| 6,699,531 B1 | 3/2004 | Fukiage |
| 6,716,751 B2 | 4/2004 | Todd |
| 6,723,606 B2 | 4/2004 | Flagan |
| 6,740,909 B2 | 5/2004 | Enquist |
| 6,756,281 B2 | 6/2004 | Enquist |
| 6,771,410 B1 | 8/2004 | Bourianoff |
| 6,804,062 B2 | 10/2004 | Atwater |
| 6,818,529 B2 | 11/2004 | Bachrach et al. |
| 6,821,825 B2 | 11/2004 | Todd et al. |
| 6,822,326 B2 | 11/2004 | Enquist et al. |
| 6,858,107 B2 | 2/2005 | Ghyselen et al. |
| 6,858,517 B2 | 2/2005 | Martinez et al. |
| 6,864,585 B2 | 3/2005 | Enquist |
| 6,867,073 B1 | 3/2005 | Enquist |
| 6,875,671 B2 | 4/2005 | Faris |
| 6,884,696 B2 | 4/2005 | Aga et al. |
| 6,900,115 B2 | 5/2005 | Todd |
| 6,902,987 B1 | 6/2005 | Tong et al. |
| 6,905,557 B2 | 6/2005 | Enquist |
| 6,962,858 B2 | 11/2005 | Neyret et al. |
| 6,962,859 B2 | 11/2005 | Todd et al. |
| 7,019,339 B2 | 3/2006 | Atwater |
| 7,029,995 B2 | 4/2006 | Todd et al. |
| 7,166,520 B1 * | 1/2007 | Henley .................. 438/458 |
| 2002/0168868 A1 | 11/2002 | Todd |
| 2002/0173113 A1 | 11/2002 | Todd |
| 2002/0190269 A1 | 12/2002 | Atwater |
| 2002/0197831 A1 | 12/2002 | Todd et al. |
| 2003/0082300 A1 | 5/2003 | Todd et al. |
| 2003/0095340 A1 | 5/2003 | Atwater |
| 2003/0111013 A1 | 6/2003 | Oosterlaken et al. |
| 2003/0129545 A1 | 7/2003 | Kik |
| 2003/0230629 A1 | 12/2003 | Bourianoff |
| 2003/0230778 A1 | 12/2003 | Park et al. |
| 2004/0214434 A1 | 10/2004 | Atwater |
| 2005/0026400 A1 | 2/2005 | Todd et al. |
| 2005/0026432 A1 | 2/2005 | Atwater |
| 2005/0085049 A1 | 4/2005 | Atwater |
| 2005/0092235 A1 | 5/2005 | Brabant et al. |
| 2005/0142879 A1 | 6/2005 | Atwater |
| 2005/0153524 A1 | 7/2005 | Maa et al. |
| 2005/0208740 A1 | 9/2005 | Todd |
| 2005/0245049 A1 | 11/2005 | Akatsu et al. |
| 2005/0247924 A1 | 11/2005 | Atwater |
| 2005/0250302 A1 | 11/2005 | Todd et al. |
| 2005/0272222 A1 | 12/2005 | Flamand et al. |
| 2005/0275067 A1 | 12/2005 | Atwater |
| 2006/0019464 A1 | 1/2006 | Maa et al. |
| 2006/0021565 A1 | 2/2006 | Zahler |
| 2006/0024435 A1 | 2/2006 | Holunga |
| 2006/0030124 A1 | 2/2006 | Maa et al. |
| 2006/0030131 A1 | 2/2006 | Richardson |
| 2006/0060943 A1 | 3/2006 | Mohamed et al. |
| 2006/0071213 A1 | 4/2006 | Ma et al. |
| 2006/0088985 A1 | 4/2006 | Haverkort et al. |
| 2006/0108688 A1 | 5/2006 | Richardson |
| 2006/0112986 A1 | 6/2006 | Atwater |

OTHER PUBLICATIONS

Bennett et al., Complete Surface Exfoliation of 4H-SiC by H+- and Si+ Coimplantation, Applied Physics Letters, vol. 76, No. 22, May 29, 2000.

Brendel, A Novel Process for Ultrathin Monocrystalline Silicon Solar Cells on Glass, 14th European Photovoltaic Solar Energy Conference, Jun. 30-Jul. 4, 1997, Barcelona, Spain.

Brendel, Crystalline Thin-film Silicon Solar Cells from Layer-Transfer Processes: A Review, Proc. 10th Workshop on Cyrstalline Silicon Solar Cell Materials and Processes, Aug. 13-16, 2000, Copper Mountain, USA, ed. by B.L. Sopori, (NREL, Golden, 2000).

Deboer, Low Temperature Epitaxial Silicon Growth Using Electron Cyclotron Resonance Plasma Deposition, Dissertation, Iowa State University, Ames, IA 1995.

Deboer et al., Preparation and Properties of High Quality Crystalline Silicon Films Grown by ECR Plasma Deposition, IEEE, Hawaii, Dec. 5-9, 1994.

De Moor, Technology Development for 3D Integration at IMEC "3D Architectures for Semiconductor Integration and Packaging", Tempe AZ Jun. 13-15, 2005.

Deng et. al., High Efficiency and High Rate Deposited Amorphous Silicon-Based Solar Cells, Phase II, Annual Technical Progress Report, Sep. 1, 2002 to Aug. 31, 2003 NREL Subcontract No. NDY-2-30630-08.

Du et. al., Impact of Hydrogen dilution of Microstructure and Optoelectronic Properties of Silicon Films Deposited using Trisilane, J. Phys D: Appl. Phys. 38 (2005) pp. 838-842.

Duo et al., Comparison Between the Different Implantation Orders in H+ and He+ Coimplantation, Journal of Physics D: Applied Physics, 34, 477-482, 2001.

Ellis Jr., et. al., Chemical Vapor Deposition of Boron-Doped Hydrogenated Amorphous Silicon, App. Phys. Lett, 47 (2), Jul. 15, 1985, p. 135.

Feijoo et al., Prestressing of Bonded Wafers. Proceedings of the First International Symposium on Semiconductor Wafer Bonding: Science, Technology and Applications, The Electrochemical Society, Vol. 92-7, New York, NY 1992.

Garrou, 3D Integration: A Status Report "3D Architectures for Semiconductor Integration and Packaging", Tempe AZ Jun. 13-15, 2005.

Gösele, Semiconductor Wafer Bonding: Science Technology and Applications, Electrochemical Society Proceedings, vol. 97-36, pp. 229-248.

Gui et al., The Effect of Surface Roughness on Direct Wafer Bonding, Journal of Applied Physics vol. 85, No. 10, May 15, 1999.

Gui et al., Selective Wafer Bonding by Surface Roughness Control, Journal of the Electrochemical Society, 148 (4), G225-228, 2001.

Henttinen et al., Cold Ion-Cutting of Hydrogen Implanted Si, Nuclear Instruments and Methods in Physics Research B, 190, 761-766, 2002.

Huff et. al. Silicon Materials Science and Technology, Electrochemical Society Proceedings vol. 98-1, pp. 1385-1394.

Hurley et al., Ion Implantation of Hydrogen and Helium into Silicon Wafers for Layer Transfer in Devices, Vacuum, 78, 167-175, 2005.

Joly, New Wafer to Wafer and Chip to Wafer Device Stacking Technology Implementations "3D Architectures for Semiconductor Integration and Packaging", Tempe AZ Jun. 13-15, 2005.

Kumata et. al., Photochemical Vapor Deposition of Hydrogenated Amorphous Silicon Films from Disilane and Trisilane using a Low Pressure Mercury Lamp, Appl. Phys. Lett 48 (20) May 19, 1986, p. 1380.

Lee et al., Strained Silicon Thin-Film Transistors Fabricated on Glass, Applied Physics Letters, 86, 103504, Feb. 2005.

Morrison et. al., Deposition of Amorphous and Micro-Crystalline Silicon using a Graphite Filament in the Hot Wire CVD Technique, J. Vac. Sci. Technol A19 (6), Nov./Dec. 2001, p. 2817.

Reber et. al., Progress in High-Temperature Silicon Epitaxy using the RTCVD160 Processor, presented at the 19th European Solar Energy Conference, Jun. 7-11, 2004, Paris.

Roth et. al., Kinetics of Solid Phase Epitaxy in Thick Amorphous Si Layers formed by MeV Ion Implantation, Appl. Phys. Lett 57 (13) Sep. 24, 1990, p. 1340.

Saraswat, 3-Dimensional ICs: Motivation, Performance Analysis and Technology "3D Architectures for Semiconductor Integration and Packaging", Tempe AZ Jun. 13-15, 2005.

Sarma et al., Silicon-on-Quartz for Low Power Electronic Applications, Proceedings 1994 IEEE International SOI Conference, Oct. 1994.

Shi et al., Characterization of Low-Temperature Processed Single-Crystalline Silicon Thin-Film Transistor on Glass, IEEE Electron Device Letters, vol. 24, No. 9, Sep. 2003.

Stradins et. al., Physics of Solid-Phase Epitaxy of Hydrogenated Amorphous Silicon for Thin Film Si Photovoltaics, Materials Research Society Spring Meeting, San Francisco, 2006.

Takagi et al., Wafer-Scale Room-Temperature Bonding Between Silicon and Ceramic Wafers by Means of Argon-Beam Surface Activation, IEEE, 2001.

Tong et al., Low Temperature Si Layer Splitting, Proceedings 1997 IEEE International SOI Conference, Oct. 1997.

Venezia et al., The Role of Implantation Damage in the Production of Silicon-On-Insulator Films by Co-Implantation of He+ and He+, Proceedings of the Eighth International Symposium on Silicon Materials Science and Technology, vol. 98-1, 1998.

Voltaix Currents, Responding to Trends in Solar, Voltaix Currents, Spring Newsletter, Apr. 2005.

Walker, 3D Packaging: Density, Design and Decisions "3D Architectures for Semiconductor Integration and Packaging", Tempe AZ Jun. 13-15, 2005.

Wang et. al, 17.8% P Type Heterojunction Silicon Solar Cells by HWCVD, National Renewable Energy Laboratory, Colorado, PowerPoint Presentation, Spring 2006.

Weldon et al., On The Mechanism of The Hydrogen-Induced Exfoliation of Silicon, J. Vac. Science Tech. B, 15(4), Jul./Aug. 1997.

Weldon et al., Mechanistic Studies of Silicon Wafer Bonding and Layer Exfoliation, Proceedings of the Fourth National Symposium on Semiconductor Wafer Bonding: Science, Technology, and Applications, vol. 97-36, 1998.

Weldon et al., Mechanism of Silicon Exfoliation Induced by Hydrogen/Helium co-Implantation, Applied Physics Letter, vol. 73, No. 25, Dec. 21, 1998.

B.N. Mukashev et al., *Hydrogen Implantation into Silicon: Infra-Red Absorption Spectra and Electrical Properties*, Institute of High Energy Physics, Academy of Sciences of the Kazakh SSR, Alma-Ata1; 91, 509 (1985).

\* cited by examiner

THIN HANDLE SUBSTRATE METHOD AND STRUCTURE FOR FABRICATING DEVICES USING ONE OR MORE FILMS PROVIDED BY A LAYER TRANSFER PROCESS

CROSS-REFERENCE TO RELATED APPLICATION

This Application is a continuation application claiming priority to U.S. application Ser. No. 11/199,870 filed Aug. 8, 2005, now U.S. Pat. No. 7,166,520 commonly assigned herewith, and hereby incorporated by reference for all purposes.

BACKGROUND OF THE INVENTION

The present invention relates to the manufacture of substrates. More particularly, the invention provides a technique including a method and a structure for forming multi-layered substrate structures for the fabrication of substrates for semiconductor integrated circuit devices using layer transfer techniques. But it will be recognized that the invention has a wider range of applicability; it can also be applied to other types of substrates for three-dimensional packaging of integrated semiconductor devices, photonic devices, piezoelectronic devices, flat panel displays, microelectromechanical systems ("MEMS"), nano-technology structures, sensors, actuators, solar cells, biological and biomedical devices, and the like.

From the very early days, human beings have been building useful articles, tools, or devices using less useful materials for numerous years. In some cases, articles are assembled by way of smaller elements or building blocks. Alternatively, less useful articles are separated into smaller pieces to improve their utility. A common example of these articles to be separated include substrate structures, such as a glass plate, a diamond, a semiconductor substrate, a flat panel display, and others. These substrate structures are often cleaved or separated using a variety of techniques. In some cases, the substrates can be separated using a saw operation. The saw operation generally relies upon a rotating blade or tool, which cuts through the substrate material to separate the substrate material into two pieces. This technique, however, is often extremely "rough" and cannot generally be used for providing precision separations in the substrate for the manufacture of fine tools and assemblies. Additionally, the saw operation often has difficulty separating or cutting extremely hard and or brittle materials, such as diamond or glass. The saw operation also cannot be used effectively for the manufacture of microelectronic devices, including integrated circuit devices, and the like.

Accordingly, techniques have been developed to fabricate microelectronic devices, commonly called semiconductor integrated circuits. Such integrated circuits are often developed using a technique called the "planar process" developed in the early days of semiconductor manufacturing. An example of one of the early semiconductor techniques is described in U.S. Pat. No. 2,981,877, in the name of Robert Noyce, who has been recognized as one of the father's of the integrated circuit. Such integrated circuits have evolved from a handful of electronic elements into millions and even billions of components fabricated on a small slice of silicon material. Such integrated circuits have been incorporated into and control many of today's devices, such as computers, cellular phones, toys, automobiles, and all types of medical equipment.

Conventional integrated circuits provide performance and complexity far beyond what was originally imagined. In order to achieve improvements in complexity and circuit density (i.e., the number of devices capable of being packed onto a given chip area), the size of the smallest device feature, also known as the device "geometry", has become smaller with each generation of integrated circuits. Increasing circuit density has not only improved the complexity and performance of integrated circuits but has also provided lower cost parts to the consumer.

Making devices smaller is very challenging, as each process used in integrated fabrication has a limit. That is to say, a given process typically only works down to a certain feature size, and then either the process or the device layout needs to be changed. Additionally, as devices require faster and faster designs, process limitations exist with certain conventional processes and materials. An example of such a process is an ability to make the thickness of the substrate thin after the manufacture of the integrated circuit devices thereon. A conventional process often used to thin these device layers is often called "back grinding," which is often cumbersome, prone to cause device failures, and can only thin the device layer to a certain thickness. Although there have been significant improvements, such back grinding processes still have many limitations.

Accordingly, certain techniques have been developed to cleave a thin film of crystalline material from a larger donor substrate portion. These techniques are commonly known as "layer transfer" processes. Such layer transfer processes have been useful in the manufacture of specialized substrate structures, such as silicon on insulator or display substrates. As merely an example, a pioneering technique was developed by Francois J. Henley and Nathan Chung to cleave films of materials. Such technique has been described in U.S. Pat. No. 6,013,563 titled Controlled Cleaving Process, assigned to Silicon Genesis Corporation of San Jose, Calif., and hereby incorporated by reference for all purposes. Although such technique has been successful, there is still a desire for improved ways of manufacturing multilayered structures.

From the above, it is seen that a technique for manufacturing large substrates which is cost effective and efficient is desirable.

BRIEF SUMMARY OF THE INVENTION

According to the present invention, techniques related to the manufacture of substrates are provided. More particularly, the invention provides a technique including a method and a structure for forming multi-layered substrate structures for the fabrication of substrates for semiconductor integrated circuit devices using layer transfer techniques. But it will be recognized that the invention has a wider range of applicability; it can also be applied to other types of substrates for three-dimensional packaging of integrated semiconductor devices, photonic devices, piezoelectronic devices, flat panel displays, microelectromechanical systems ("MEMS"), nano-technology structures, sensors, actuators, solar cells, biological and biomedical devices, and the like.

In a specific embodiment, the present invention provides a method for fabricating one or more devices, e.g., integrated circuits. The method includes providing a substrate (e.g., silicon), which has a thickness of semiconductor material and a surface region. The substrate also has a cleave plane provided within the substrate to define the thickness of semiconductor material. The method includes joining the surface region of the substrate to a first handle substrate. In a preferred embodiment, the first handle substrate is termed a "thin" substrate, which provides suitable bonding characteristics, can withstand high temperature processing often desired during the manufacture of semiconductor devices, and has desirable de-bonding characteristics between it and a second handle substrate, which will be described in more detail below. In a preferred embodiment, the first handle substrate is also thick enough and rigid enough to allow for cleaving according to a specific embodiment.

In a specific embodiment, the method also includes initiating a controlled cleaving action at a portion of the cleave plane to detach the thickness of semiconductor material from the substrate, while the thickness of semiconductor material remains joined to the first handle substrate, to expose a second surface region of the thickness of semiconductor material. The method includes joining a backside of the first handle substrate to a second handle substrate. In a preferred embodiment, the method includes processing the second handle substrate with the thickness of semiconductor material using one or more processes to form at least one integrated circuit device onto a portion of the thickness of semiconductor material. The method forms a planarized surface region overlying the thickness of semiconductor material and joins the planarized surface region to a face of a third handle substrate. The method includes removing the second handle substrate from the first handle substrate including the thickness of semiconductor material, while the face of the third handle substrate remains joined to the planarized surface region.

Numerous benefits are achieved over pre-existing techniques using the present invention. In particular, the present invention uses controlled energy and selected conditions to preferentially cleave a thin film of material without a possibility of damage to such film from excessive energy release. This cleaving process selectively removes the thin film of material from the substrate while preventing a possibility of damage to the film or a remaining portion of the substrate. Additionally, the present method and structures allow for more efficient processing using a cleave layer provided in a substrate through the course of semiconductor processing, which may occur at higher temperatures, according to a specific embodiment. Once the cleaved layer has been subjected to integrated circuit processing techniques, a handle substrate, which held the cleaved layer is selectively removed. In a preferred embodiment, the present invention provides a "thin" handle substrate, which can remain and be used for device processing, including manufacture of interconnections, other devices, any combination of these, and the like. Depending upon the embodiment, one or more of these benefits may be achieved. These and other benefits may be described throughout the present specification and more particularly below.

The present invention achieves these benefits and others in the context of known process technology. However, a further understanding of the nature and advantages of the present invention may be realized by reference to the latter portions of the specification and attached drawings.

DETAILED DESCRIPTION OF THE INVENTION

According to the present invention, techniques related to the manufacture of substrates are provided. More particularly, the invention provides a technique including a method and a structure for forming multi-layered substrate structures for the fabrication of substrates for semiconductor integrated circuit devices using layer transfer techniques. But it will be recognized that the invention has a wider range of applicability; it can also be applied to other types of substrates for three-dimensional packaging of integrated semiconductor devices, photonic devices, piezoelectronic devices, flat panel displays, microelectromechanical systems ("MEMS"), nano-technology structures, sensors, actuators, solar cells, biological and biomedical devices, and the like.

Figure 1:
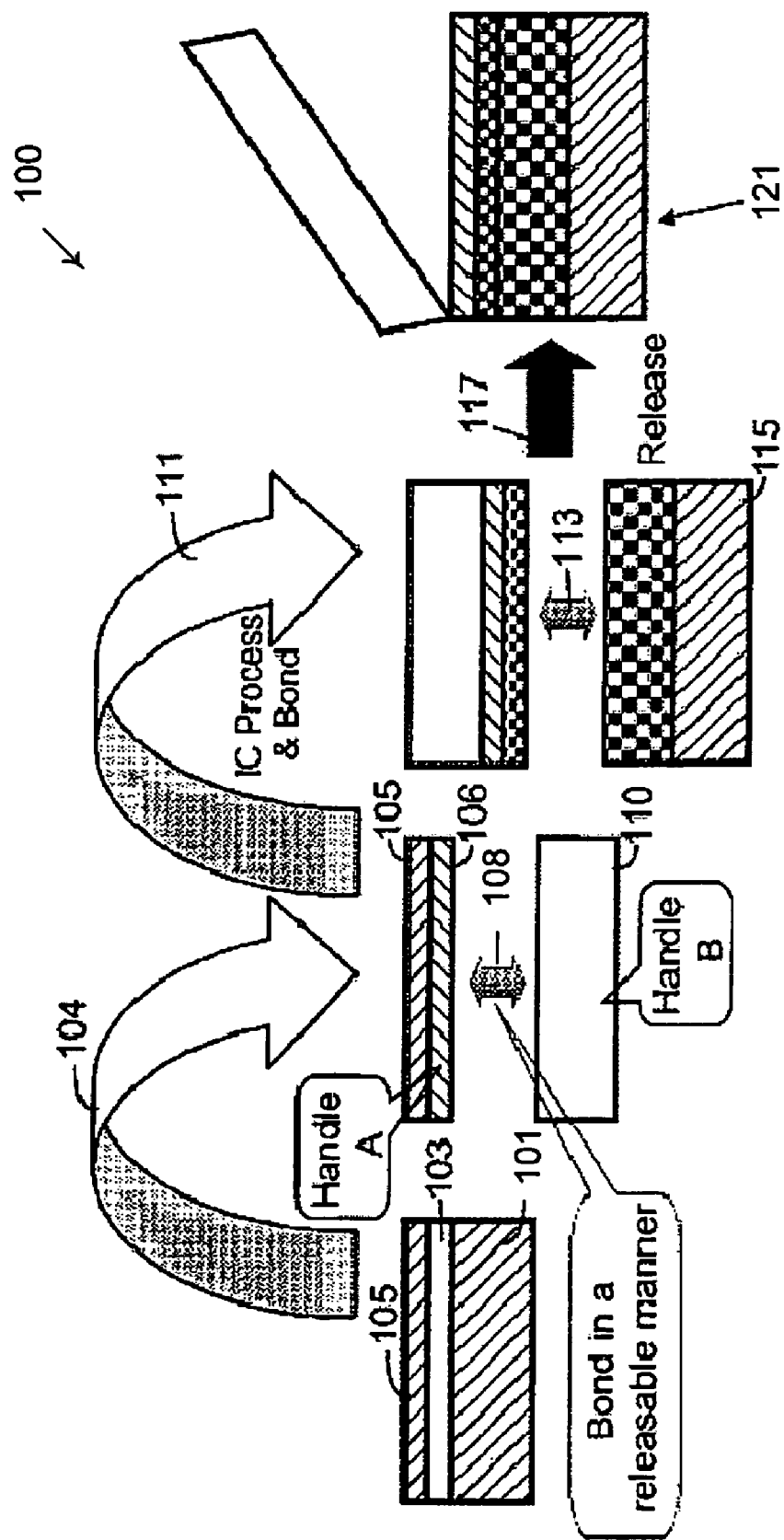
FIG. 1 illustrates an overall simplified method for manufacturing integrated circuits on a layer transferred substrate using a thin handle substrate according to embodiments of the present invention.
Figure 2:
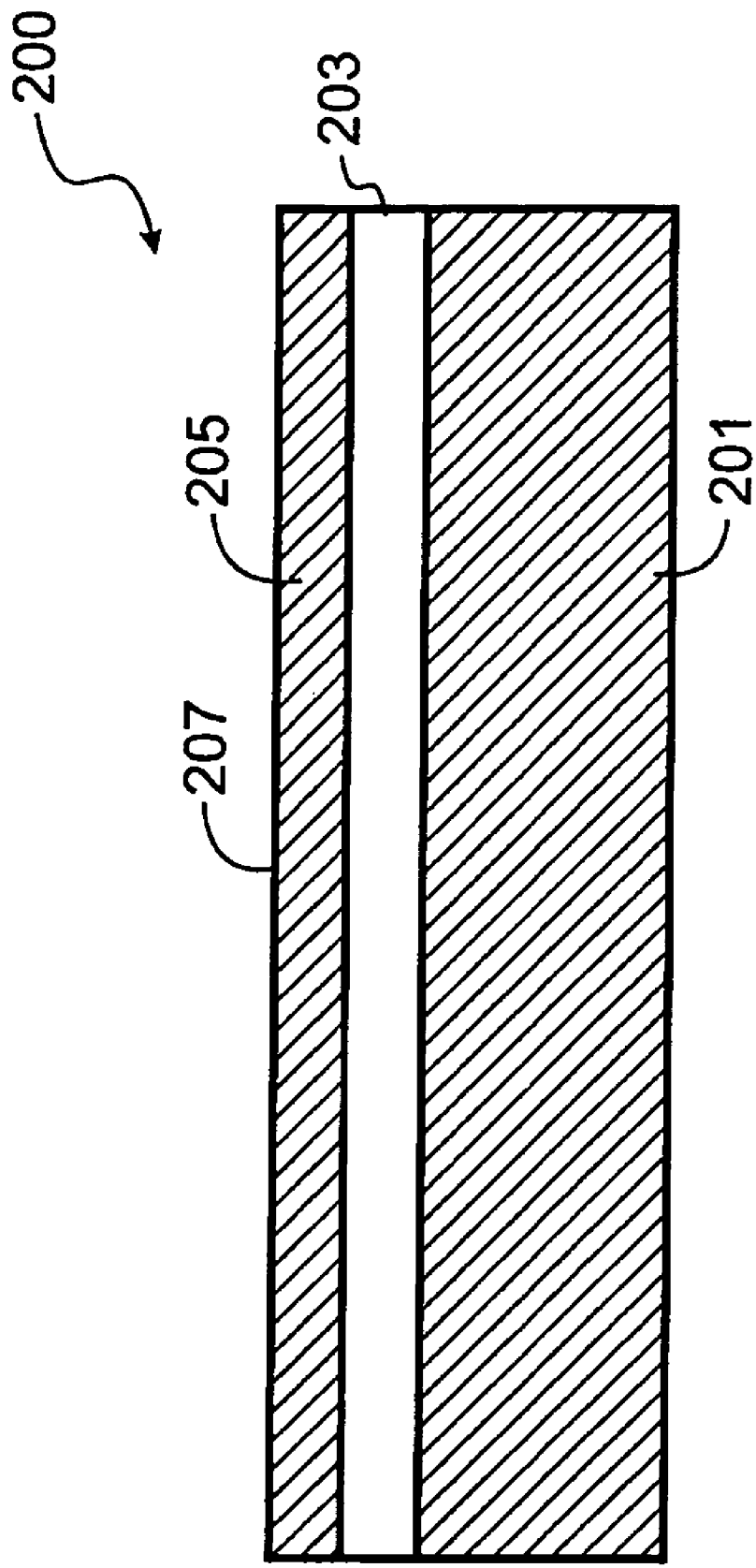
FIGS. 2 through 11 illustrate a simplified method for manufacturing integrated circuits on a layer transferred substrate using a thin handle substrate according to embodiments of the present invention.

Referring to FIG. 1, a method 100 for fabricating integrated circuits on a layer transferred substrate according to embodiments of the present invention may be outlined as follows:

1 Provide a semiconductor substrate 101, e.g., silicon, germanium, a silicon-germanium alloy, gallium arsenide, any Group III/V materials, and others;

2. Form a cleave plane 103 (including a plurality of particles, deposited material, or any combination of these, and the like) to define a thickness of semiconductor material 105 (which is from a donor substrate) provided within the semiconductor substrate;

3. Join (step 104) the surface region of the substrate to a first handle substrate 106, which is the thin handle substrate;

4. Initiate a controlled cleaving action at a portion of the cleave plane to detach the thickness of semiconductor material 105 from the substrate, while the thickness of semiconductor material remains joined to the first handle substrate 106;

5. Join (step 108) a backside of the first handle substrate to a second handle substrate 110;

6. Process (step 111) the first handle substrate with the thickness of semiconductor material and attached second handle substrate using one-or more processes to form at least one integrated circuit device onto a portion of the thickness of semiconductor material, while the thickness of semiconductor material remains joined to the first handle substrate, which remains joined to the second handle substrate;

7. Form a planarized surface region overlying the thickness of semiconductor material;

8. Join (step 113) the planarized surface region of the thickness of material on the first substrate to a face of a third handle substrate 115, which may include a bulk substrate material or be multi-layered;

9. Selectively remove the second handle substrate from the first handle substrate, while the face of the third handle substrate remains joined to the planarized surface region and while the first handle substrate remains joined to the thickness of semiconductor material;

10. Form a resulting third handle substrate 121 and first handle substrate including the sandwiched thickness of material with at least one integrated circuit device thereon;

11. Optionally, the above steps can be repeated again for at least one or more other layers, which includes other integrated circuit device elements or other features; and 12. Perform other steps, as desired.

The above sequence of steps provides a method according to an embodiment of the present invention. As shown, the method uses a combination of steps including a way of forming multiple handle substrates including a thickness of material, which is subjected to processing. At least one of the handle substrates is a thin substrate that preferably remains on the thickness of material throughout the processing. The other handle substrate is selectively removed and/or cleaved after processing while the thickness of material large substrate (including the first thin substrate) is transferred to another substrate structure according to a specific embodiment. Other alternatives can also be provided where steps are added, one or more steps are removed, or one or more steps are provided in a different sequence without departing from the scope of the claims herein. Further details of the present method can be found throughout the present specification and more particularly below.

FIGS. 2 through 11 illustrate a simplified method for manufacturing integrated circuits on a layer transferred substrate according to embodiments of the present invention. These diagrams are merely illustrations that should not unduly limit the scope of the claims herein. One of ordinary skill in the art would recognize other variations, modifications, and alternatives. As shown, the method includes providing a semiconductor substrate 200, e.g., silicon, germanium, a silicon-germanium alloy, gallium arsenide, any Group III/V materials, and others. In a specific embodiment, the semiconductor substrate can be made of a single homogenous material, or a combination of various layers, depending upon the specific embodiment. Of course, there can be other variations, modifications, and alternatives.

In a preferred embodiment, the substrate 201 has a thickness of semiconductor material 205 and a surface region 207. In a specific embodiment, the substrate also has a cleave plane 203 (including a plurality of particles, deposited material, or any combination of these, and the like) provided within the substrate, which defines the thickness of semiconductor material. Of course, there can be other variations, modifications, and alternatives.

Depending upon the embodiment, the cleave region can be formed using a variety of techniques. That is, the cleave region can be formed using any suitable combination of implanted particles, deposited layers, diffused materials, patterned regions, and other techniques. In a specific embodiment, the method introduces certain energetic particles using an implant process through a top surface of the semiconductor substrate, which can be termed a donor substrate, to a selected depth, which defines the thickness of the semiconductor material region, termed the "thin film" of material. A variety of techniques can be used to implant the energetic particles into a single crystal silicon wafer according to a specific embodiment. These techniques include ion implantation using, for example, beam line ion implantation equipment manufactured from companies such as Applied Materials, Inc. and others. Alternatively, implantation occurs using a plasma immersion ion implantation ("PIII") technique, ion shower, and other non-mass specific techniques can be particularly effective for larger surface regions according to a specific embodiment. Combination of such techniques may also be used. Of course, techniques used depend upon the application.

Depending upon the application, smaller mass particles are generally selected to reduce a possibility of damage to the material region according to a preferred embodiment. That is, smaller mass particles easily travel through the substrate material to the selected depth without substantially damaging the material region that the particles traverse through. For example, the smaller mass particles (or energetic particles) can be almost any charged (e.g., positive or negative) and or neutral atoms or molecules, or electrons, or the like. In a specific embodiment, the particles can be neutral and or charged particles including ions such as ions of hydrogen and its isotopes, rare gas ions such as helium and its isotopes, and neon, or others depending upon the embodiment. The particles can also be derived from compounds such as gases, e.g., hydrogen gas, water vapor, methane, and hydrogen compounds, and other light atomic mass particles. Alternatively, the particles can be any combination of the above particles, and or ions and or molecular species and or atomic species. The particles generally have sufficient kinetic energy to penetrate through the surface to the selected depth underneath the surface.

Using hydrogen as the implanted species into the silicon wafer as an example, the implantation process is performed using a specific set of conditions. Implantation dose ranges from about 1015 to about 1018 atoms/cm$^2$, and preferably the dose is greater than about 1016 atoms/cm$^2$. Implantation energy ranges from about 1 KeV to about 1 MeV, and is generally about 50 KeV. Implantation temperature ranges from about −20 to about 600 Degrees Celsius, and is preferably less than about 400 Degrees Celsius to prevent a possibility of a substantial quantity of hydrogen ions from diffusing out of the implanted silicon wafer and annealing the implanted damage and stress. The hydrogen ions can be selectively introduced into the silicon wafer to the selected depth at an accuracy of about +/−0.03 to +/−0.05 microns. Of course, the type of ion used and process conditions depend upon the application.

Effectively, the implanted particles add stress or reduce fracture energy along a plane parallel to the top surface of the substrate at the selected depth. The energies depend, in part, upon the implantation species and conditions. These particles reduce a fracture energy level of the substrate at the selected depth. This allows for a controlled cleave along the implanted plane at the selected depth. Implantation can occur under conditions such that the energy state of the substrate at all internal locations is insufficient to initiate a non-reversible fracture (i.e., separation or cleaving) in the substrate material. It should be noted, however, that implantation does generally cause a certain amount of defects (e.g., micro-detects) in the substrate that can typically at least partially be repaired by subsequent heat treatment, e.g., thermal annealing or rapid thermal annealing. Of course, there can be other variations, modifications, and alternatives.

Depending upon the embodiment, there may be other techniques for forming a cleave region and/or cleave layer. As merely an example, such cleave region is formed using other processes, such as those using a silicon-germanium cleave plane developed by Silicon Genesis Corporation of Santa Clara, Calif. and processes such as the SmartCut™ process of Soitec SA of France, and the Eltran™ process of Canon Inc. of Tokyo, Japan, any like processes, and others. Of course, there may be other variations, modifications, and alternatives.

Figure 3:
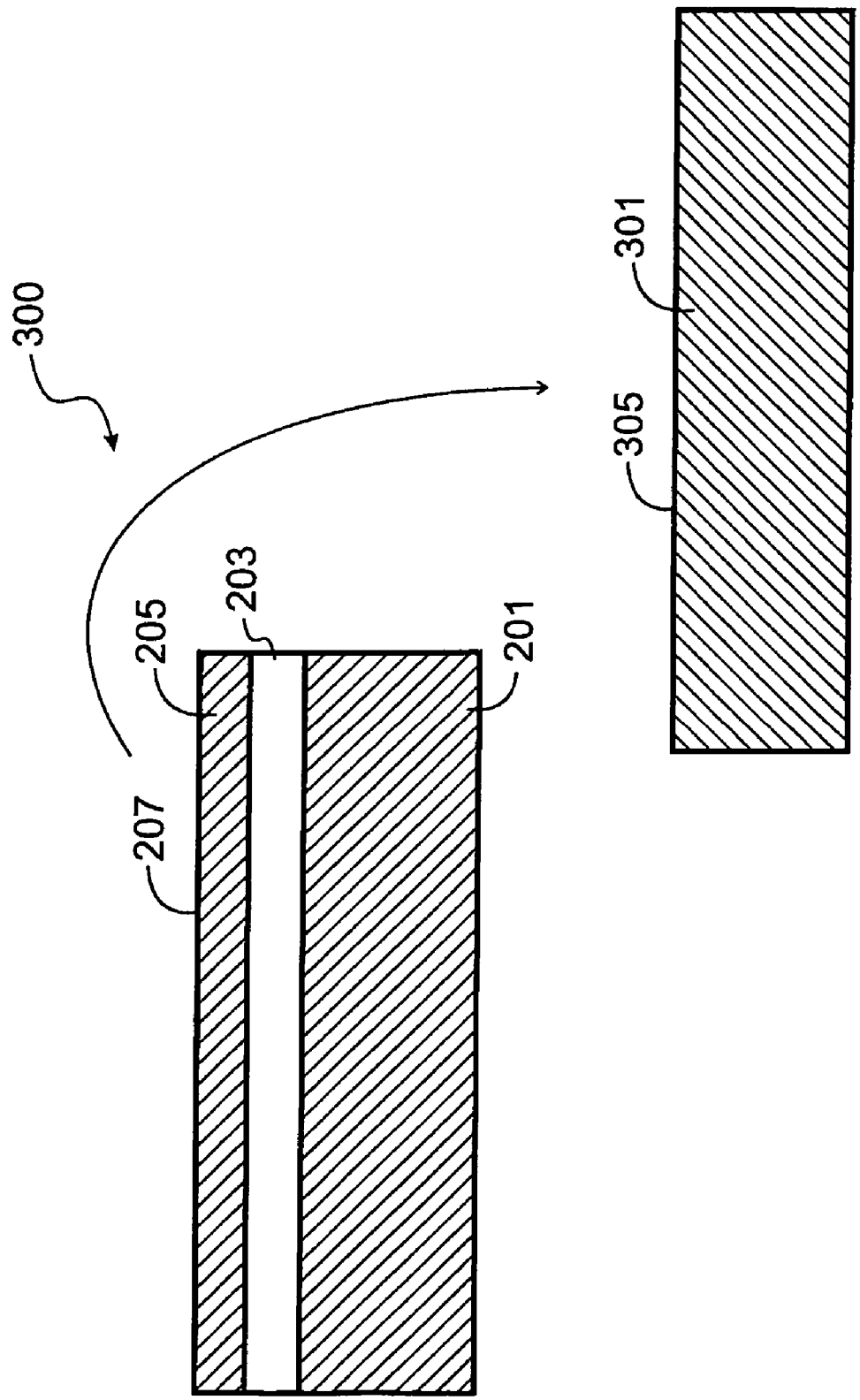

Referring now to FIG. 3, the method includes joining 300 the surface region of the semiconductor substrate to a first handle substrate 301. In a specific embodiment, the handle substrate is made of a suitable material that remains fixed to the thickness of material, but can also be selectively and/or easily removed from a second substrate, which will be described in more detail below. That is, the handle substrate can be made of a thin layer of silicon or the same type of material as the thickness of semiconductor material, which is layer transferred. The thin layer can be a single homogeneous material, multiple materials, or any combination of these. The first handle substrate is a silicon substrate according to a specific embodiment. In this embodiment, the first handle substrate can be attached to the thickness of material using an oxide interface layer which can act as an etch stop in the eventual thinning or removal of the first handle substrate. In a specific embodiment, the first handle substrate is a silicon substrate having a thickness of 300 microns and less. Additionally, the first handle substrate can be selectively removed from the second handle substrate although the second handle substrate firmly engages with the first handle substrate to withstand a temperature of about 1000 degrees centigrade and greater according to a specific embodiment. In a preferred embodiment, the first handle substrate and the second handle substrate are joined with a bond strength ranging from about 200-500 milli-Joules per square meter. The specific bond energy is chosen such that the resulting bond strength is sufficiently high to allow for device processing while low enough to allow for reparation after device processing. One method to engineer a suitably low bond energy is to tune the plasma processing parameters and the pre-bond surface roughness to accomplish the desired surface bond energy after the device process thermal cycles. Of course, there can be other handle substrate material such as ceramic or polysilicon substrates depending upon the specific embodiment. Key considerations for suitability of a material as the first or second handle is the difference in thermal expansion coefficient, cost, and availability.

In a preferred embodiment, the first handle substrate has a surface region 305, which will be joined and/or bonded with surface region 207 provided on substrate 201. Like reference numerals are used in this figure has others, but are not intended to be limiting the scope of the claims herein. Further details of the joining process can be found throughout the present specification and more particularly below.

Before joining, the surface regions of the material from the semiconductor substrate and the first handle substrate surfaces are each subjected to a cleaning solution to treat the surfaces of the substrates to clean the substrate surface regions according to a specific embodiment. An example of a solution used to clean the substrate and handle surfaces is a mixture of hydrogen peroxide and sulfuric acid, and other like solutions. A dryer dries the semiconductor substrate and handle surfaces to remove any residual liquids and/or particles from the substrate surfaces. Self-bonding occurs by placing surfaces of cleaned substrates (e.g., semiconductor substrate surface and handle substrate surface) together after an optional plasma activation process depending on the specific layer-transfer process used. If desired, such plasma activated processes clean and/or activate the surfaces of the substrates. The plasma activated processes are provided, for example, using an oxygen or nitrogen bearing plasma at 20° C. to 40° C. temperature. The plasma activated processes are preferably carried out in dual frequency plasma activation system manufactured by Silicon Genesis Corporation of San Jose, Calif. Of course, there can be other variations, modifications, and alternatives, which have been described herein, as well as outside of the present specification.

Thereafter, each of these substrates is bonded together according to a specific embodiment. The substrates are preferably bonded using an EVG 850 bonding tool manufactured by Electronic Vision Group or other like processes for smaller substrate sizes such as 200 mm or 300 mm diameter wafers. Other types of tools such as those manufactured by Karl Suss may also be used. Of course, there can be other variations, modifications, and alternatives. Preferably, bonding between the handle substrates is substantially permanent and has good reliability through an entirety of the semiconductor processing steps.

Accordingly after bonding, the bonded substrate structures are subjected to a bake treatment according to a specific embodiment. The bake treatment maintains the bonded substrate at a predetermined temperature and predetermined time. Preferably, the temperature ranges from about 200 or 250 Degrees Celsius to about 400 Degrees Celsius and is preferably about 350 Degrees Celsius for about 1 hour or so for a silicon donor substrate and the first handle substrate to attach themselves to each other permanently according to the preferred embodiment. Depending upon the specific application, there can be other variations, modifications, and alternatives.

In a specific embodiment, the substrates are joined or fused together using a low temperature thermal step. In a specific embodiment, the low temperature bonding process occurs by a self-bonding process. Alternatively, an adhesive disposed on either or both surfaces of the substrates, which bond one substrate to another substrate. In a specific embodiment, the adhesive includes an epoxy, polyimide-type materials, and the like. Spin-on-glass layers can be used to bond one substrate surface onto the face of another. These spin-on-glass ("SOG") materials include, among others, siloxanes or silicates, which are often mixed with alcohol-based solvents or the like. SOG can be a desirable material because of the low temperatures (e.g., 150 to 250 degree C.) often needed to cure the SOG after it is applied to surfaces of the wafers.

Alternatively, a variety of other low temperature techniques can be used to join the donor substrate surface regions to the handle substrate. For instance, an electrostatic bonding technique can be used to join the two substrates together. In particular, one or both substrate surface(s) is charged to attract to the other substrate surface. Additionally, the donor substrate surface can be fused to the handle wafer using a variety-of other commonly known techniques. Of course, the technique used depends upon the application.

Figure 4:
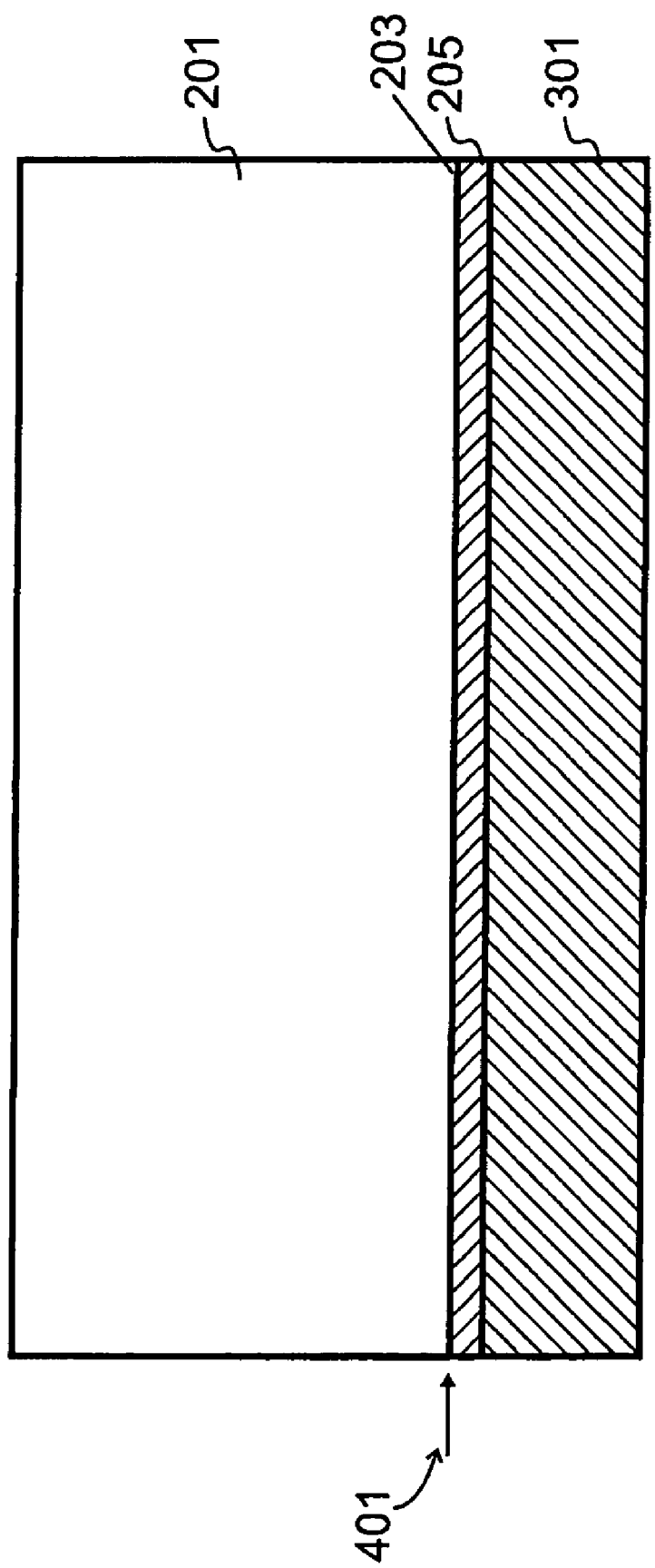

Referring to FIG. 4, the method includes initiating a controlled cleaving action using energy 401 provided at a selected portion of the cleave plane to detach the thickness of semiconductor material from the substrate, while the thickness of semiconductor material remains joined to the first handle substrate. Depending upon the specific embodiment, there can be certain variations. For example, the cleaving process can be a controlled cleaving process using a propagating cleave front to selectively free the thickness of material from the donor substrate attached to the handle substrate. Alternative techniques for cleaving can also be used. Such techniques, include, but are not limited to those called a Nanocleave™ process of Silicon Genesis Corporation of Santa Clara, Calif., a SmartCut™ process of Soitec SA of France, and an Eltran™ process of Canon Inc. of Tokyo, Japan, any like processes, and others. The method then removes the remaining portion of the semiconductor donor substrate, which provided the thickness of material to the handle substrate according to a specific embodiment.

Figure 5:
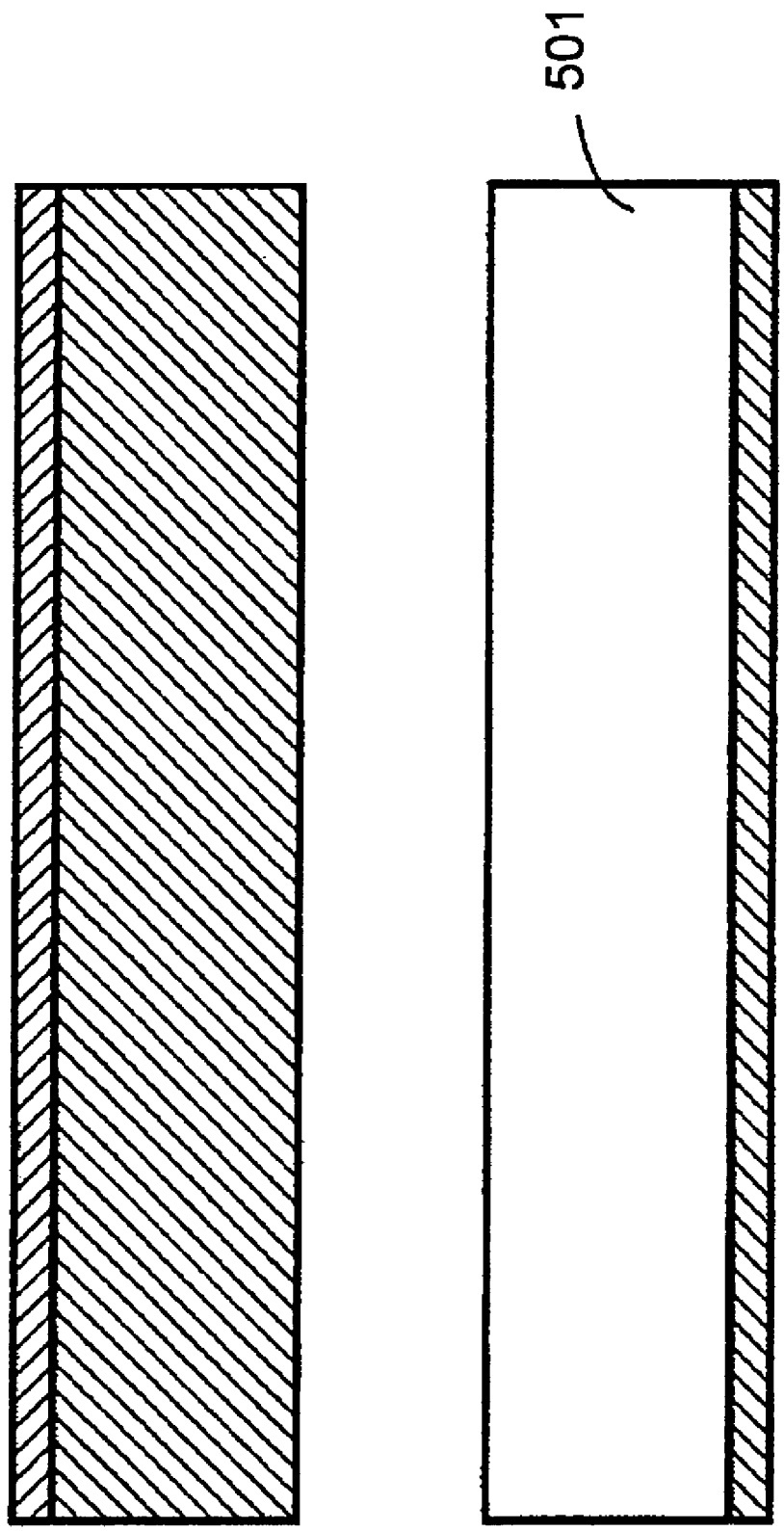
Figure 6:
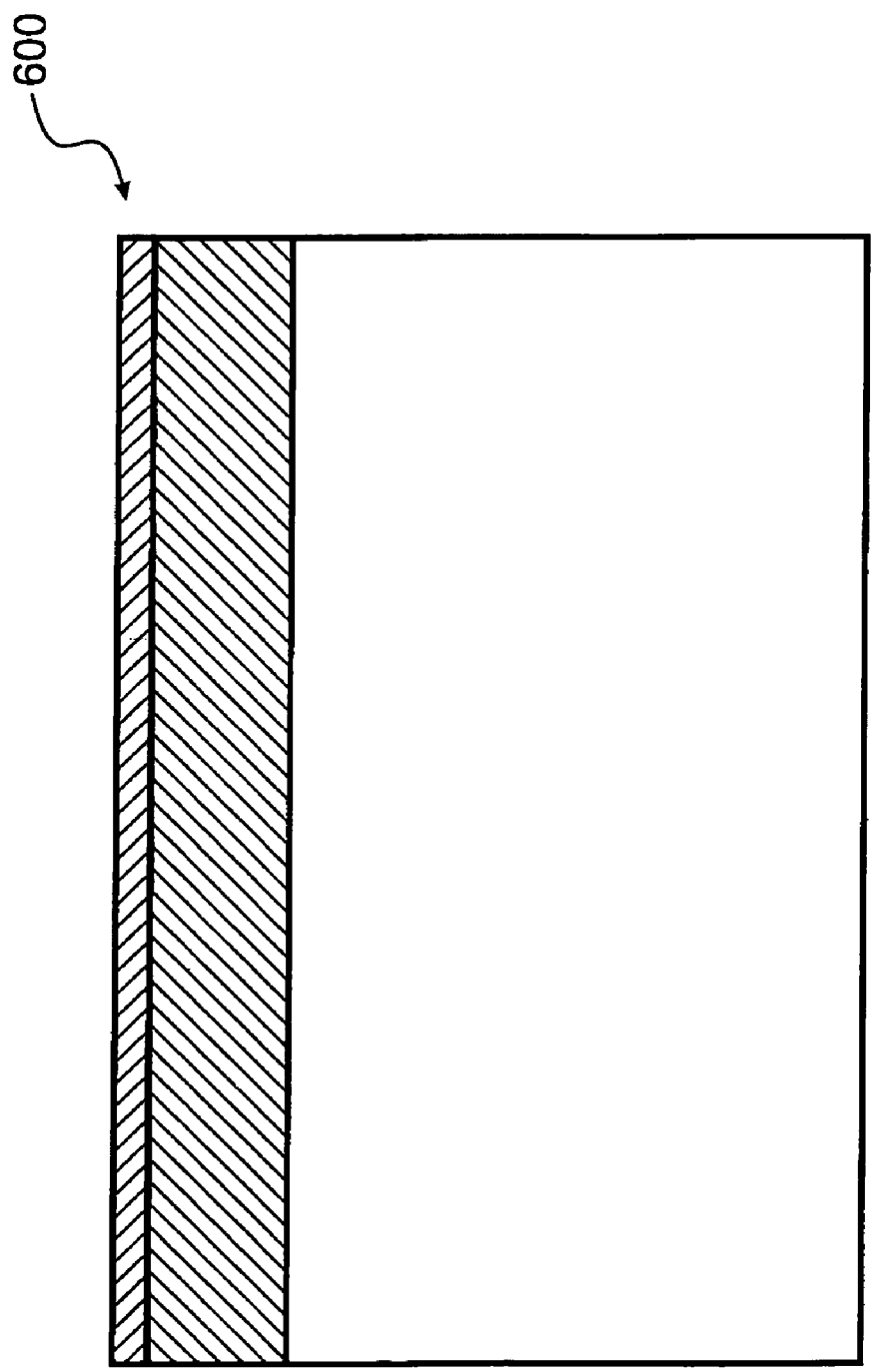

Referring to FIG. 5, the method joins a backside of the first handle substrate to a second handle substrate 110. The second handle substrate is made of a suitable material that can withstand high temperature processing while maintaining desired attachment to the first handle substrate according to a specific embodiment. The second handle substrate can also be selectively removed or desirably removed from the first handle substrate, including the thickness of material, after the high temperature process according to a preferred embodiment. As merely an example, the second handle substrate can be made of a silicon, ceramic, quartz or polysilicon, which can be removed from the first thin handle substrate made of single crystal silicon material according to a specific embodiment. Either or both surfaces here can also be oxidized but in a preferred embodiment would be roughened in a controlled manner to allow selective bond strength to be applied. Referring to FIG. 6, the method provides a resulting second handle substrate 600 attached to the first handle substrate and overlying thickness of semiconductor material according to a specific embodiment. In a preferred embodiment, the first substrate, second substrate, and thickness of material are characterized by a total thickness ranging at about 825 microns and a diameter of about 200 millimeters. Of course, there can be other modifications, variations, and alternatives.

In a specific embodiment, the resulting handle substrates and thickness of material have suitable characteristics for undergoing one or more processing steps. That is, the handle substrates can be subjected to conventional semiconductor processing techniques, including but not limited to, photolithography, etching, implanting, thermal annealing, chemical mechanical polishing, diffusion, deposition, and other others, which may be known by one of ordinary skill in the art. The second handle substrate can also be selectively removed while transferring the thin film of material onto another substrate structure according to a specific embodiment.

Figure 7:
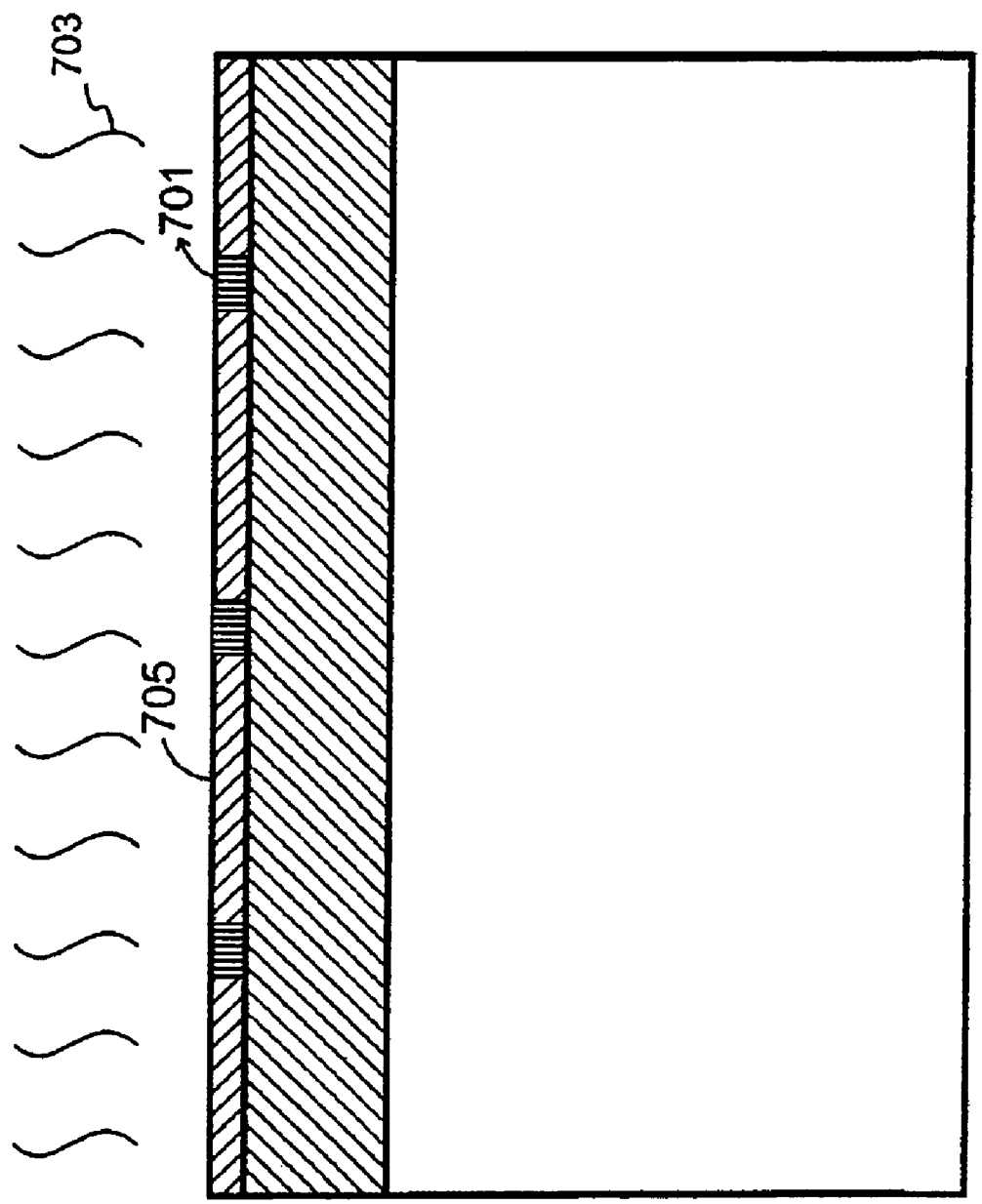

Referring to FIG. 7, the present method performs other processes on portions of the thickness of semiconductor material, which has been attached to the first handle substrate. The method forms one or more devices 701 on one or more portions of the thin film of material overlying the handle substrate surface. Such devices can include integrated semiconductor devices, photonic and/or optoelectronic devices (e.g., light valves), piezoelectronic devices, microelectromechanical systems ("MEMS"), nano-technology structures, sensors, actuators, solar cells, flat panel display devices (e.g., LCD, AMLCD), biological and biomedical devices, and the like. Such devices can be made using deposition, etching, implantation, photo masking processes, any combination of these, and the like. Of course, there can be other variations, modifications, and alternatives. Additionally, other steps can also be formed, as desired.

In a preferred embodiment, the processing includes high temperature semiconductor processing techniques 703 to form conventional integrated circuits thereon. The method forms a planarized surface region 705 overlying the thickness of semiconductor material. In a specific embodiment, the planarized surface region can be formed using one or more suitable techniques. Such techniques include deposition of a dielectric layer, which is later reflowed using thermal treatment. The planarized surface region can also be formed using a chemical mechanical polishing process including a suitable slurry, pad, and process according to a specific embodiment. The planarized surface region can also be formed using any combination of these techniques and others according to a specific embodiment. The planarized surface region preferably has a uniformity of about 0.1% to about 5% end to end, and is within about 15 Angstroms RMS in roughness as measured on a 2 micron by 2 micron atomic-force microscope scan. Of course, there can be other variations, modifications, and alternatives.

Figure 8:
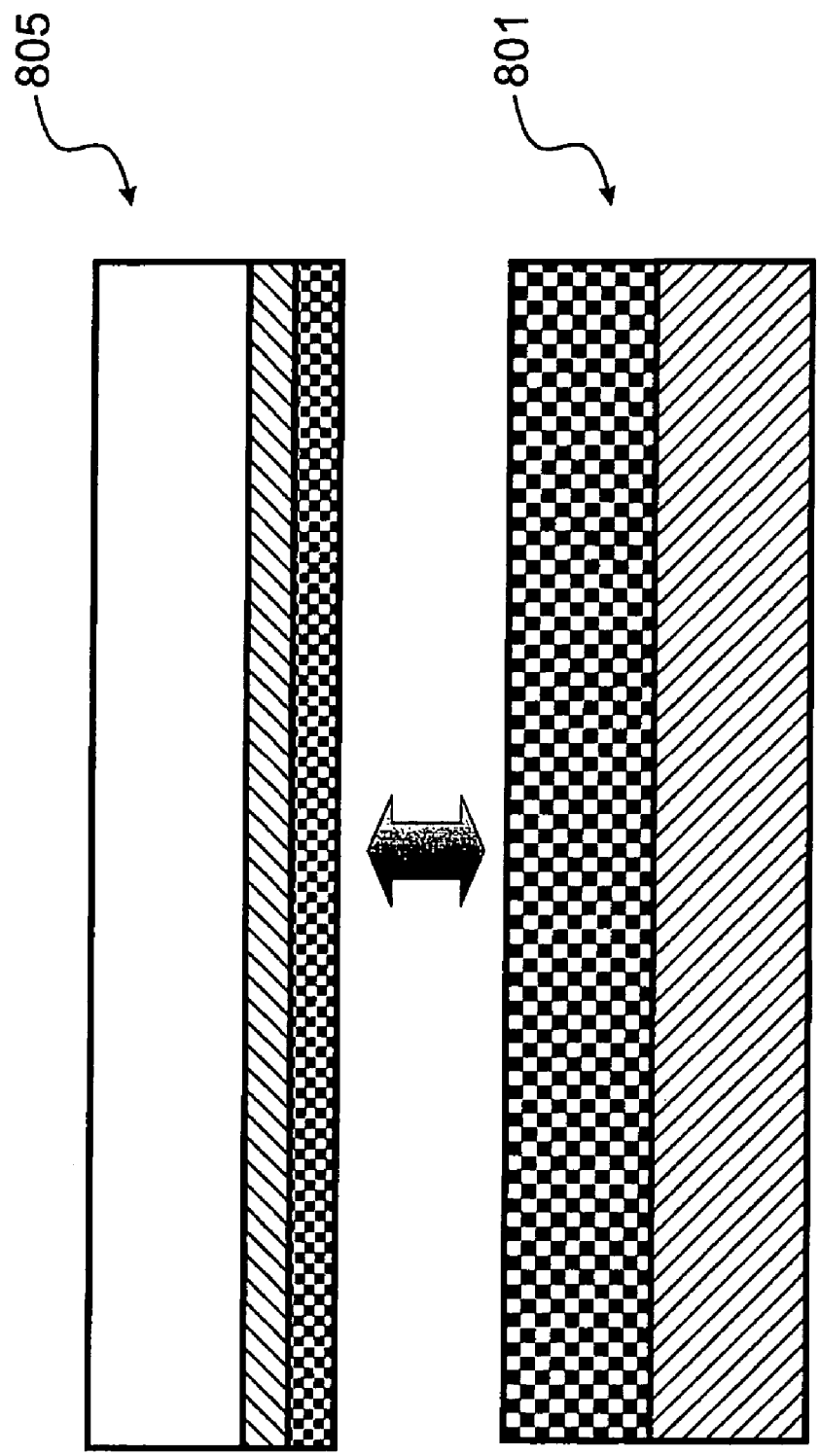

In a specific embodiment, the method also joins the planarized surface region of the resulting processed handle substrate 805 to a face of a third handle substrate 801, as illustrated by FIG. 8. Before joining, the planarized surface region overlying the thickness of material and the third handle substrate surfaces are each subjected to a cleaning solution to treat the surfaces of the substrates to clean the substrate surface regions according to a specific embodiment. An example of a solution used to clean the substrate and handle surfaces is a mixture of hydrogen peroxide and sulfuric acid, and other like solutions. A dryer dries the semiconductor substrate and the third handle surfaces to remove any residual liquids and/or particles from the substrate surfaces. Self-bonding occurs by placing surfaces of cleaned substrates (e.g., planarized region and third handle substrate surface) together after an optional plasma activation process depending on the specific layer-transfer process used. If desired, such plasma activated processes clean and/or activate the surfaces of the processed substrates. The plasma activated processes are provided, for example, using an oxygen or nitrogen bearing plasma at 20° C. to 40° C. temperature. The plasma activated processes are preferably carried out in dual frequency plasma activation system manufactured by Silicon Genesis Corporation of San Jose, Calif. Of course, there can be other variations, modifications, and alternatives, which have been described herein, as well as outside of the present specification.

Thereafter, each of these substrates (and processed devices) is bonded together according to a specific embodiment. As shown, the third handle substrate has been bonded to the planarized surface region. The substrates are preferably bonded using an EVG 850 bonding tool manufactured by Electronic Vision Group or other like processes for smaller substrate sizes such as 200 mm or 300 mm diameter wafers. Other types of tools such as those manufactured by Karl Suss may also be used. Of course, there can be other variations, modifications, and alternatives. Preferably, bonding between the third handle substrate and the planarized surface is substantially permanent and has good reliability.

Accordingly after bonding, the bonded substrate structures are subjected to a bake treatment according to a specific embodiment. The bake treatment maintains the bonded substrate at a predetermined temperature and predetermined time. Preferably, the temperature ranges from about 200 or 250 Degrees Celsius to about 400 Degrees Celsius and is preferably about 350 Degrees Celsius for about 1 hour or so for a planarized substrate region and the third handle substrate to attach themselves to each other permanently according to the preferred embodiment. Depending upon the specific application, there can be other variations, modifications, and alternatives.

In a specific embodiment, the substrates are joined or fused together using a low temperature thermal step. In a specific embodiment, the low temperature bonding process occurs by a self-bonding process. Alternatively, an adhesive disposed on either or both surfaces of the substrates, which bond one substrate to another substrate. In a specific embodiment, the adhesive includes an epoxy, polyimide-type materials, and the like. Spin-on-glass layers can be used to bond one substrate surface onto the face of another. These spin-on-glass ("SOG") materials include, among others, siloxanes or silicates, which are often mixed with alcohol-based solvents or the like. SOG can be a desirable material because of the low temperatures (e.g., 150 to 250 degree C.) often needed to cure the SOG after it is applied to surfaces of the wafers.

Alternatively, a variety of other low temperature techniques can be used to join the substrate surface region to the handle substrate. For instance, an electro-static bonding technique can be used to join the two substrates together. In particular, one or both substrate surface(s) is charged to attract to the other substrate surface. Additionally, the donor substrate surface can be fused to the handle wafer using a variety of other commonly known techniques. Of course, the technique used depends upon the application.

Figure 9:
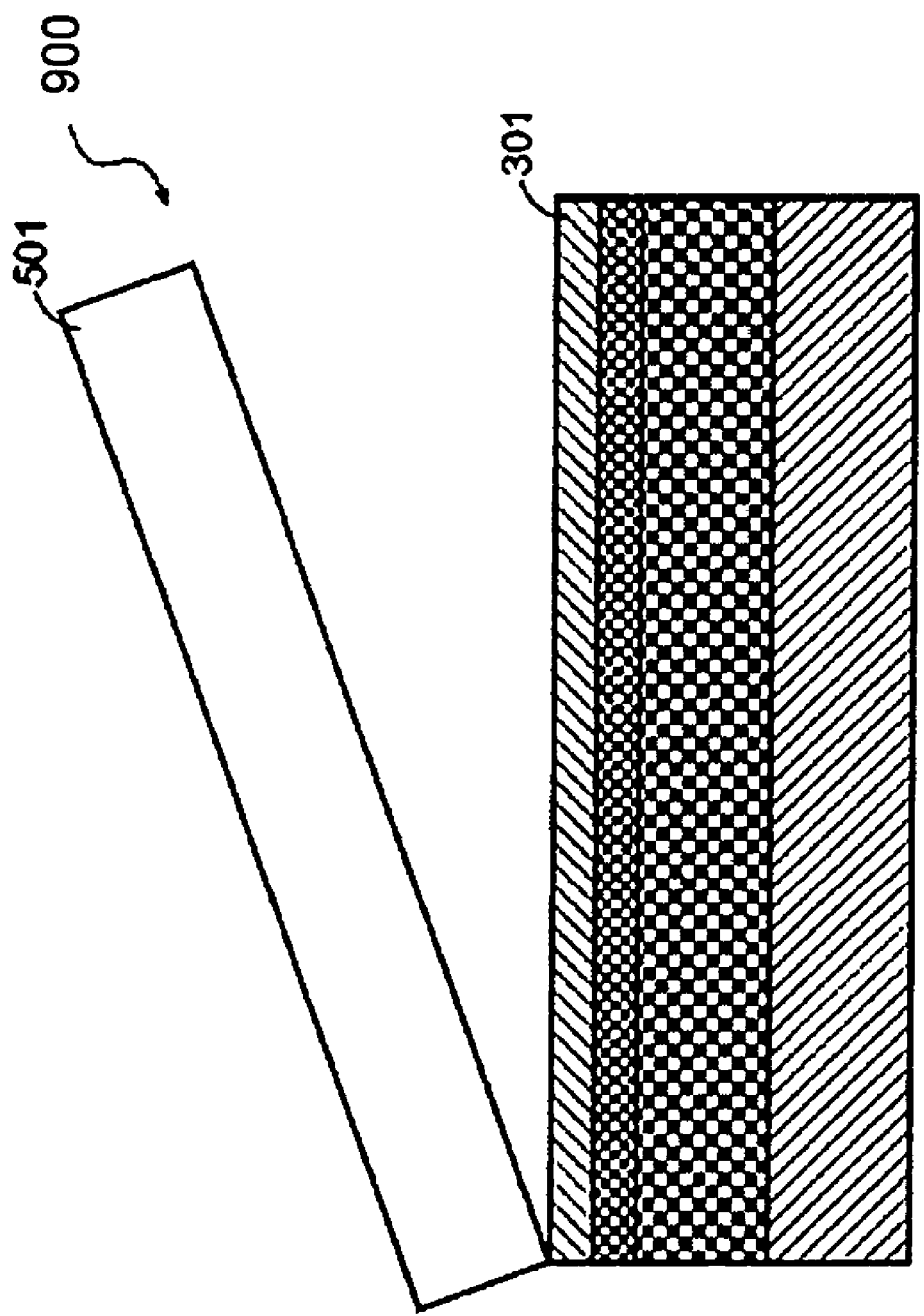
Figure 10:
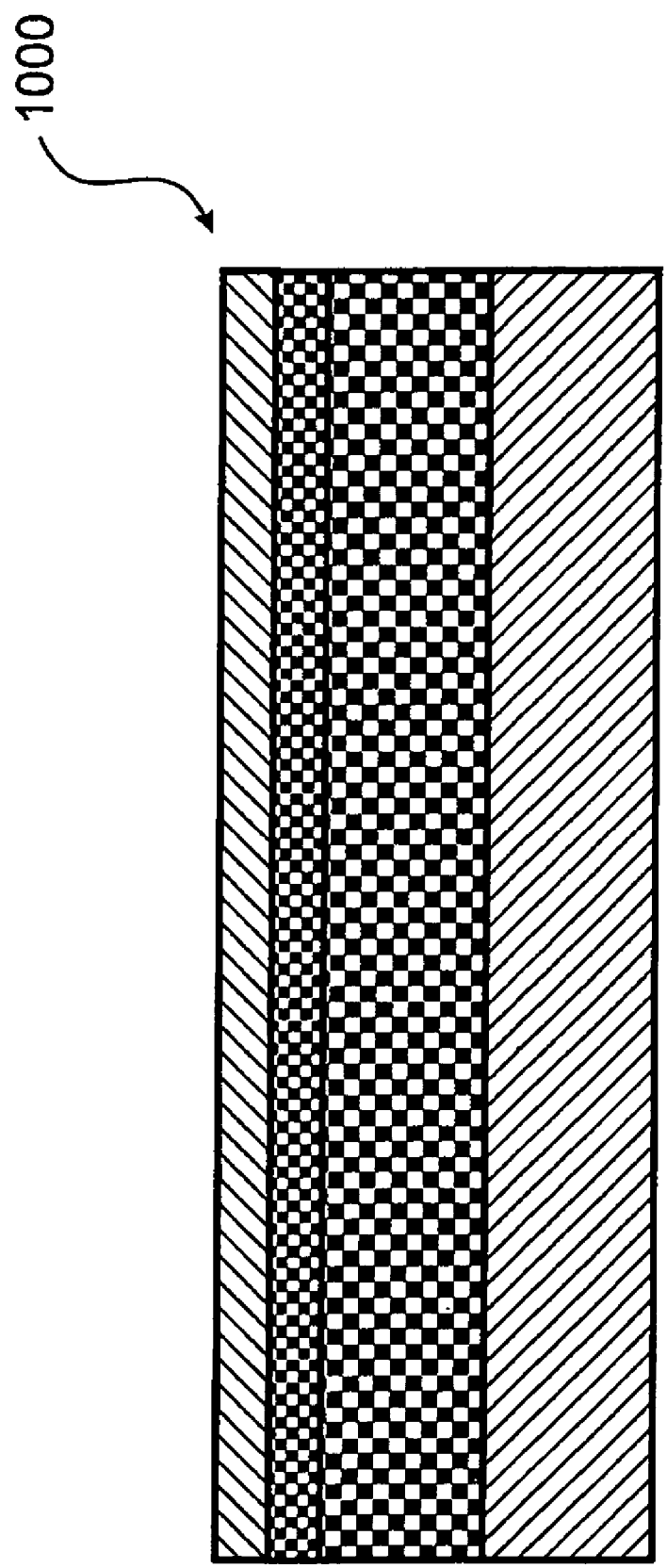

In a specific embodiment, the method selectively removes 900 the second handle substrate from the first handle substrate, while the face of the third handle substrate remains joined the thickness of material, which remains joined to the first handle substrate, as illustrated by FIG. 9. In a specific embodiment, the method uses a selective etching solution to selectively remove the second handle substrate from the first handle substrate. In a preferred embodiment, the solution is hydrofluoric acid if the second substrate is quartz. Alternatively, the preferred method would be to utilize a cleaving action to remove the second handle substrate from the first handle substrate according to a specific embodiment. This would be made possible by the engineering of the first to second handle wafer bond energy to be made low enough while the surface energy of the third handle surface to the thickness of material was made substantially higher. In this fashion, the cleaving could be successfully initiated and propagated through the first and second handle interface. Of course, there can be other variations, modifications and alternatives.

Optionally, the method can use a combination of techniques to remove the first handle substrate from the second handle substrate to form a resulting substrate 1000, as illustrated by FIG. 9. In a specific embodiment, the method can apply a grinding process, such as "back grind" to remove a certain thickness of material from the second handle substrate. After such material has been removed, the method can selectively remove any remaining material using a selective etching process, which may be a dry and/or wet etching process according to a specific embodiment. Alternatively, the method can use a chemical mechanical polishing process to remove a certain thickness of the second handle substrate according to a specific embodiment. That is, chemical mechanical polishing can be used in combination with any of the techniques described herein, as well as other, and can be used alone according to a specific embodiment. Alternatively, any of these techniques may also be combined with cleaving techniques according to a specific embodiment.

Figure 11:
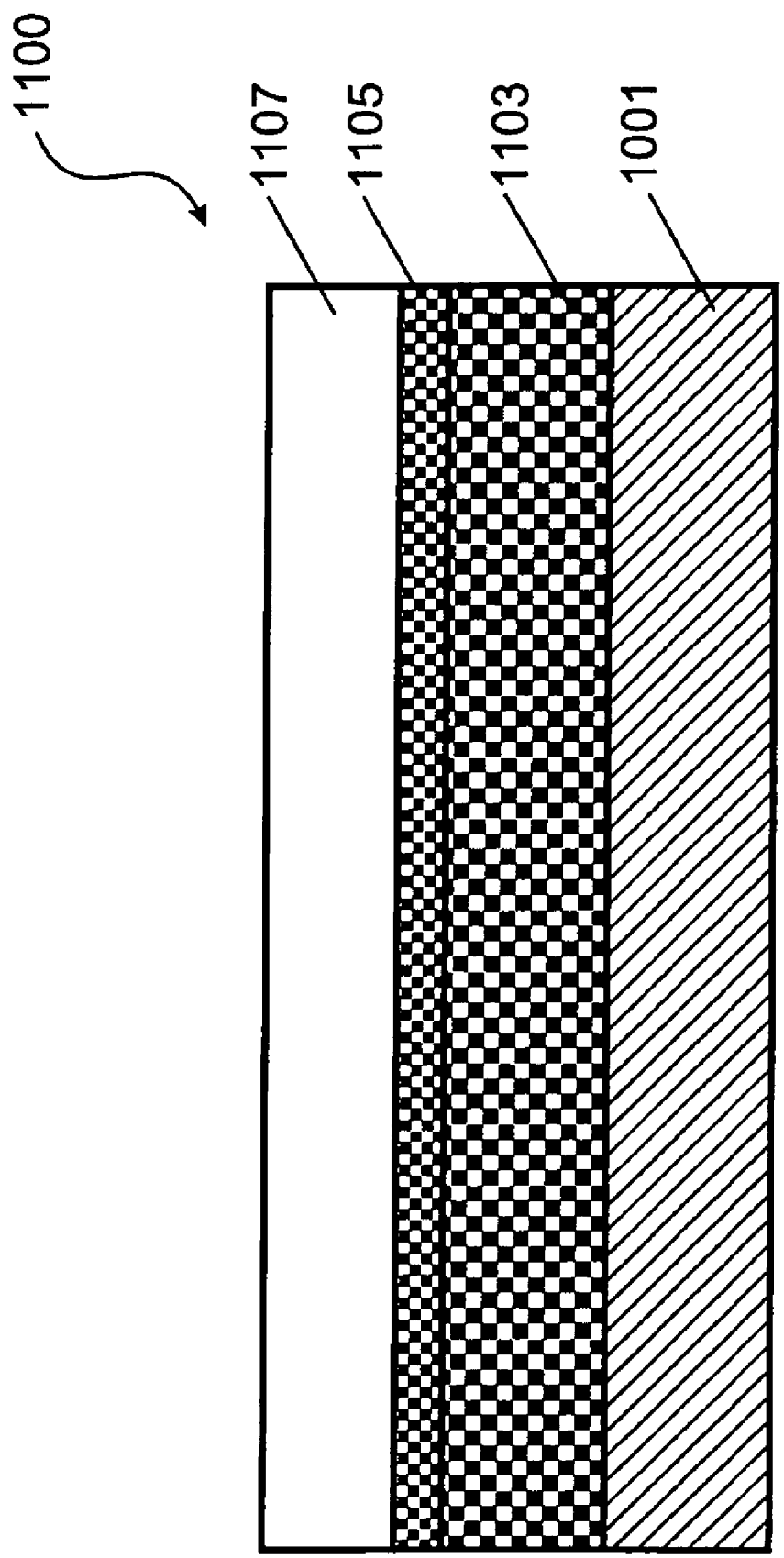

Additionally processes may include repeating the layer transfer processes to form resulting multi-layered substrate structure 1100 according to a specific embodiment, as illustrated by FIG. 11. The structure 1100 includes bulk substrate 1001. The bulk substrate includes an overlying layer 1103, which may be a layer transferred layer or other layer. The overlying layer 1103 includes layer transferred layer 1105, which has processed and completed device structures thereon. Overlying layer 1105 includes one or more layers 1107, which also may be layer transferred, deposited, or any combination of these, according to a specific embodiment. Of course, there can be other variations, modifications, and alternatives.

While the above is a full description of the specific embodiments, various modifications, alternative constructions and equivalents may be used. Therefore, the above description and illustrations should not be taken as limiting the scope of the present invention which is defined by the appended claims.

What is claimed is:

1. A method comprising:
    initiating controlled cleaving at a portion of a cleave plane to detach a thickness of a semiconductor material from a substrate while the thickness remains joined to a frontside of a first handle substrate, thereby exposing a surface of the thickness of semiconductor material;
    joining a backside of the first handle substrate to a second handle substrate;
    forming an integrated circuit device on the surface;
    forming a planarized layer overlying the surface and the integrated circuit device;
    joining the planarized layer to a third handle substrate; and
    removing the second handle substrate from the first handle substrate including the thickness of semiconductor material, while the third handle substrate remains joined to the planarized layer.

2. The method of claim 1 wherein the integrated circuit device is selected from a MOSFET, a CMOS device, an active device, a capacitor, a resistor, and an inductor.

3. The method of claim 1 wherein the cleave plane comprises a plurality of particles, a strained region, a weakened region, or a deposited material.

4. The method of claim 3 wherein the a plurality of particles are hydrogen bearing particles.

5. The method of claim 3 wherein the cleave plane is formed by implantation of hydrogen into the substrate.

6. The method of claim 3 wherein the cleave plane is formed by implantation of helium into the substrate.

7. The method of claim 1 further comprising patterning the first handle substrate coupled to the third handle substrate to form one or more via structures.

8. The method of claim 1 wherein the joining comprises a bonding process selected from a glue process, an electro static process, a non-organic glue process, an anodic process, a plasma activation process, or a wet activation process.

9. The method of claim 1 wherein the substrate is selected from a silicon wafer, a silicon on insulator wafer, a silicon bearing material, a single layer substrate, and a multi-layer substrate.

10. The method of claim 1 wherein the planarized layer is selected from an oxide containing material, a nitride containing material, spin-on-glass, and metal.

11. The method of claim 1 further comprising subjecting the planarized layer and the third handle substrate to a cleaning solution.

12. The method of claim 1 wherein the second handle substrate is removed from the first handle substrate by an etching process, a cleaving process, a grinding process, or a chemical mechanical polishing process.

13. A method for fabricating a device on a substrate, the method comprising:
    joining a surface region of a substrate to a first handle substrate;
    initiating a controlled cleaving action at a portion of a cleave plane in the substrate to detach the thickness of semiconductor material from the substrate while the thickness remains joined to the first handle substrate;
    joining a backside of the first handle substrate to a second handle substrate;
    forming a device on a portion of the thickness of semiconductor material;
    forming a planarized surface region overlying the thickness;
    joining the planarized surface region to a face of a third handle substrate; and removing the second handle substrate from the first handle substrate including the thickness of semiconductor material, while the face of the third handle substrate remains joined to the planarized surface region.

14. The method of claim 13 wherein the first handle substrate is a silicon substrate having a thickness of 300 microns and less.

15. The method of claim 13 wherein the second handle substrate firmly engages with the first handle substrate to withstand a temperature of about 400 degrees Celsius and greater.

16. The method of claim 13 wherein the joining of the between the first handle substrate and the second handle substrate has a bond strength ranging from about 200-500 milliJoules per square meter.

17. The method of claim 13 further comprising patterning the first handle substrate coupled to the third handle substrate to form one or more via structures, the one or more via structures having a width to depth ratio ranging from about 1/20 to about 1/30.

18. The method of claim 13 wherein the first substrate, second substrate, and thickness of material are characterized by a total thickness ranging at about 825 microns and a diameter of about 200 millimeters.

19. The method of claim 13 wherein the controlled cleaving action forms a single propagating cleave front on the portion of the cleave plane.

20. The method of claim 13 wherein the controlled cleaving action forms more than one propagating cleave fronts on the portion of the cleave plane.

21. The method of claim 13 wherein the first handle substrate has a thickness ranging from about 5 microns to about 10 microns.

22. The method of claim 13 wherein the second handle substrate is selected from a silicon substrate, a polysilicon substrate and a quartz substrate.

23. The method of claim 13 wherein the device comprises a MOSFET, a CMOS device, an active device, a capacitor, a resistor, an inductor, a photonic device, a piezoelectric device, a microelectromechanical system, a sensor, an actuator, a solar cell, a biological device, or a display device.

24. The method of claim 13 wherein the removing comprises using a mechanical separation process to remove the second handle substrate from the first handle substrate.

25. The method of claim 13 wherein the first handle substrate is selected from a silicon substrate, a polysilicon substrate and a quartz substrate.

* * * * *